United States Patent
Hoffman et al.

(10) Patent No.: US 6,707,168 B1
(45) Date of Patent: Mar. 16, 2004

(54) SHIELDED SEMICONDUCTOR PACKAGE WITH SINGLE-SIDED SUBSTRATE AND METHOD FOR MAKING THE SAME

(75) Inventors: Paul Hoffman, Chandler, AZ (US); Doug Mathews, Gilbert, AZ (US)

(73) Assignee: Amkor Technology, Inc., Chandler, AZ (US)

(*) Notice: Subject to any disclaimer, the term of this patent is extended or adjusted under 35 U.S.C. 154(b) by 29 days.

(21) Appl. No.: 09/848,932

(22) Filed: May 4, 2001

(51) Int. Cl.[7] .............................................. H01L 23/48
(52) U.S. Cl. ...................... 257/796; 257/704; 257/712; 174/52.1; 174/35 R; 361/719; 361/720
(58) Field of Search .................... 257/704, 796; 361/719, 720, 816, 818; 174/52.1, 52.2, 52.3, 52.4, 35 R

(56) References Cited

U.S. PATENT DOCUMENTS

| | | | | |
|---|---|---|---|---|
| 4,814,943 A | * | 3/1989 | Okuaki | 361/400 |
| 5,166,772 A | | 11/1992 | Soldner et al. | 257/659 |
| 5,235,131 A | | 8/1993 | Mueller et al. | 174/35 R |
| 5,309,321 A | | 5/1994 | Olla et al. | 361/714 |
| 5,364,107 A | * | 11/1994 | Kinkead et al. | 257/673 |
| 5,365,107 A | * | 11/1994 | Kuraishi et al. | 257/673 |
| 5,371,321 A | * | 12/1994 | Hamzehdoost et al. | 174/52.4 |
| 5,521,429 A | | 5/1996 | Aono et al. | 257/676 |
| 5,530,202 A | | 6/1996 | Dais et al. | 174/35 R |
| 5,598,321 A | * | 1/1997 | Mostafazadeh et al. | 361/704 |
| 5,639,989 A | * | 6/1997 | Higgins, III | 174/35 |
| 5,650,659 A | * | 7/1997 | Mostafazadeh et al. | 257/660 |
| 5,656,864 A | * | 8/1997 | Mitsue et al. | 257/787 |
| 5,703,398 A | * | 12/1997 | Sono et al. | 257/706 |
| 5,805,427 A | * | 9/1998 | Hoffman | 361/772 |
| 5,851,337 A | * | 12/1998 | Chen | 156/275.3 |
| 5,909,057 A | * | 6/1999 | McCormick et al. | 257/704 |
| 5,939,784 A | * | 8/1999 | Glenn | 257/710 |
| 5,982,621 A | * | 11/1999 | Li | 361/704 |
| 6,092,281 A | * | 7/2000 | Glenn | 29/841 |
| 6,143,981 A | | 11/2000 | Glenn | 174/52.4 |
| 6,246,115 B1 | * | 6/2001 | Tang et al. | 257/706 |
| 6,392,309 B1 | * | 5/2002 | Wataya et al. | 257/796 |
| 6,429,512 B1 | * | 8/2002 | Huang et al. | 257/706 |
| 6,433,420 B1 | * | 8/2002 | Yang et al. | 257/712 |
| 6,569,764 B1 | * | 5/2003 | Hirashima et al. | 438/673 |
| 6,614,102 B1 | * | 9/2003 | Hoffman et al. | 257/666 |

FOREIGN PATENT DOCUMENTS

JP 63-128736 6/1988 ........... H01L/23/04

* cited by examiner

*Primary Examiner*—Kamand Cuneo
*Assistant Examiner*—Lourdes Cruz
(74) *Attorney, Agent, or Firm*—Bever, Hoffman & Harms, LLP; James E. Parsons

(57) ABSTRACT

A semiconductor chip package is disclosed. The package includes a substrate, a metallization layer formed on one side of the substrate and a semiconductor die mounted on the substrate. The semiconductor die is electrically connected to a portion of the metallization layer. A shield element is mounted on the substrate and electrically connected to a portion of the metallization layer. A package mold surrounds the semiconductor die and the shield element

21 Claims, 4 Drawing Sheets

SHIELDED SEMICONDUCTOR PACKAGE WITH SINGLE-SIDED SUBSTRATE AND METHOD FOR MAKING THE SAME

TECHNICAL FIELD OF THE INVENTION

The present invention relates to semiconductor chip packages, and in particular to a radiation-shielded semiconductor package with a single-sided substrate, and a method for making the same.

BACKGROUND OF THE INVENTION

Conventional and flip-chip integrated circuit packages using single- or double-sided epoxy laminate substrates are known. Such packages typically do not include electromagnetic interference shielding for the integrated circuit chip.

In some applications, it is desirable to shield the chip from electromagnetic interference. Electromagnetic interference is a particular problem in cellular telephones and other RF communication devices in which an antenna emits RF radiation which could affect the other circuitry operating in the phone. Electromagnetic interference shielding external to the package, which may consist of a metal casing surrounding the package, is costly and impractical. Incorporation of shielding into packages has remained problematic on a commercial scale.

SUMMARY OF THE INVENTION

Therefore, a need has arisen for a semiconductor chip package and packaging method that meets these challenges. In particular, a need has arisen for a shielded semiconductor package with a single-sided substrate, and a method for making the same.

Accordingly, a semiconductor chip package is disclosed. In one embodiment, the package includes a substrate, a metallization layer formed on one side of the substrate and a semiconductor die mounted on the substrate. The semiconductor die is electrically connected to a portion of the metallization layer. A shield element is mounted on the substrate and electrically connected to a portion of the metallization layer. A package mold surrounds the semiconductor die and the shield element.

A method for assembling a semiconductor chip package is also disclosed. In one embodiment, the method includes providing a substrate having a metallization layer formed on a single side of the substrate, attaching a semiconductor die to the substrate, electrically connecting the semiconductor die to a portion of the metallization layer, mounting an electromagnetic interference shield on the substrate, and encapsulating at least a portion of the shield and the semiconductor die with a mold material.

An advantage of the present invention is that the package provides a shield against electromagnetic interference. Another advantage is that the package has the simplicity of manufacturing associated with single-sided substrates.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF EXEMPLARY EMBODIMENTS

The exemplary embodiments of the present invention and their advantages are best understood by referring to FIGS. 1 through 8 of the drawings. Like numerals are used for like and corresponding parts of the various drawings.

Figure 1:
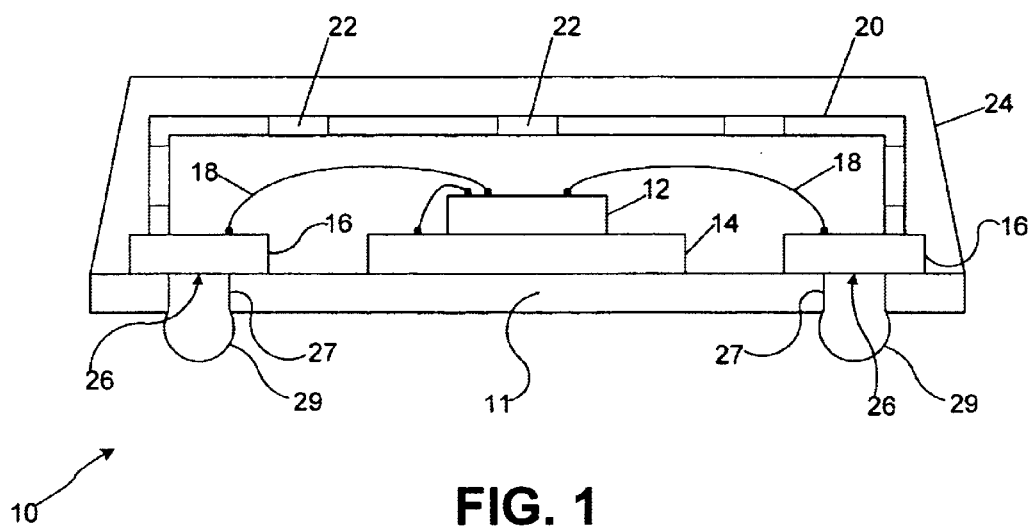
FIG. 1 is a vertical cross section of a first semiconductor chip package constructed in accordance with the present invention.

FIG. 1 is a vertical cross section of a semiconductor chip package 10 constructed in accordance with the present invention. Package 10 includes a package substrate 11, which may be a conventional epoxy laminate substrate. A die pad 14 and a set of bond fingers or pads 16 are formed on substrate 11 using conventional conductive layer fabrication techniques. Die pad and bond fingers 16 may be, for example, copper with or with gold and/or nickel plating. Substrate 11 is a single-sided substrate, meaning that a conductive layer including die pad 14, bond fingers 16 and conductive wiring (not shown) is formed on only one side of substrate 11. A semiconductor die 12 is mounted on a die pad 14 using a conventional die attach method and adhesive. Bond pads (not shown) on die 12 are electrically connected to respective bond fingers 16 by bond wires 18.

Package 10 includes a shield element 20 which shields semiconductor die 12 from electromagnetic interference. Shield element 20 may be made from any suitable metal, such as copper, nickel, chrome, stainless steel or other alloys, and may be plated with other metals to enhance corrosion resistance, improve solderability, or add to electrical shielding efficiency. For example, shield element 20 may be plated with gold, tin lead, indium, palladium, platinum and/or alloys of these or other metals. Shield element 20 is connected to selected bond fingers 16, and is grounded to provide an effective electromagnetic interference shield.

Figure 3:
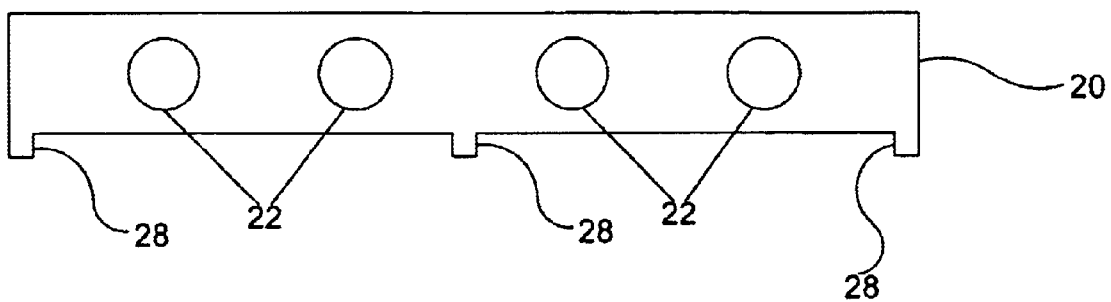
FIG. 3 is a side view of a shield element for use in the package.
Figure 4:
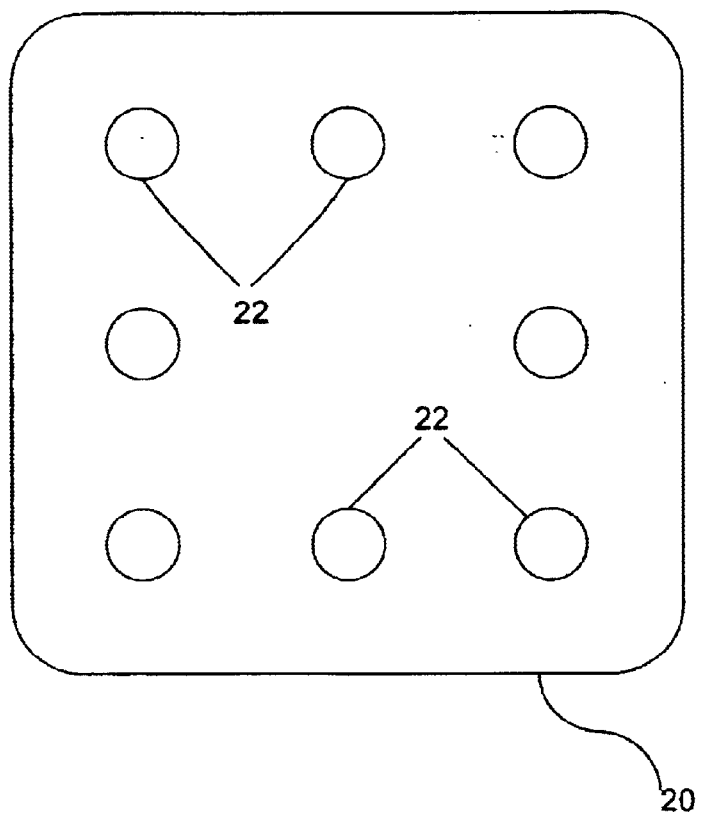
FIG. 4 is a top view of the shield element.

FIGS. 3 and 4 are side and top views, respectively, of shield element 20.

Holes 22 are formed in the top and sides of shield element 20. Holes 22 allow mold compound to reach the interior of shield element 20 during formation of the package mold, as described below.

Holes 22 are appropriately sized relative to the wavelength of the radiation from which semiconductor die 12 is to be shielded. For example, holes 22 may have a diameter no greater than one-twelfth the predominant wavelength in the spectrum of electromagnetic interference.

No holes are formed in the central area of the top of shield element 20 (see FIG. 4). This unperforated central area allows a vacuum pick-up head to pick and place shield element 20 during package assembly.

During package assembly, shield element 20 is placed on substrate 11 in electrical contact with selected bond fingers 16. As shown in FIG. 3, shield element 20 includes legs 28 which contact the selected bond fingers 16. The open spaces between legs 28 provide additional apertures for the entry of mold compound into the interior of shield element 20, thereby reduced the required number and/or diameter of holes 22 in shield element 20.

Figure 5:
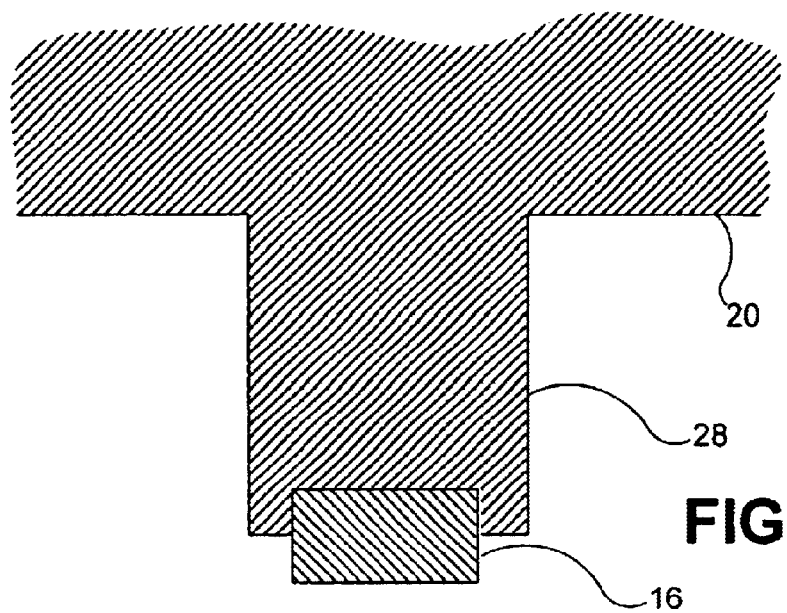
FIGS. 5 and 6 are close-up views of shield element legs.
Figure 6:
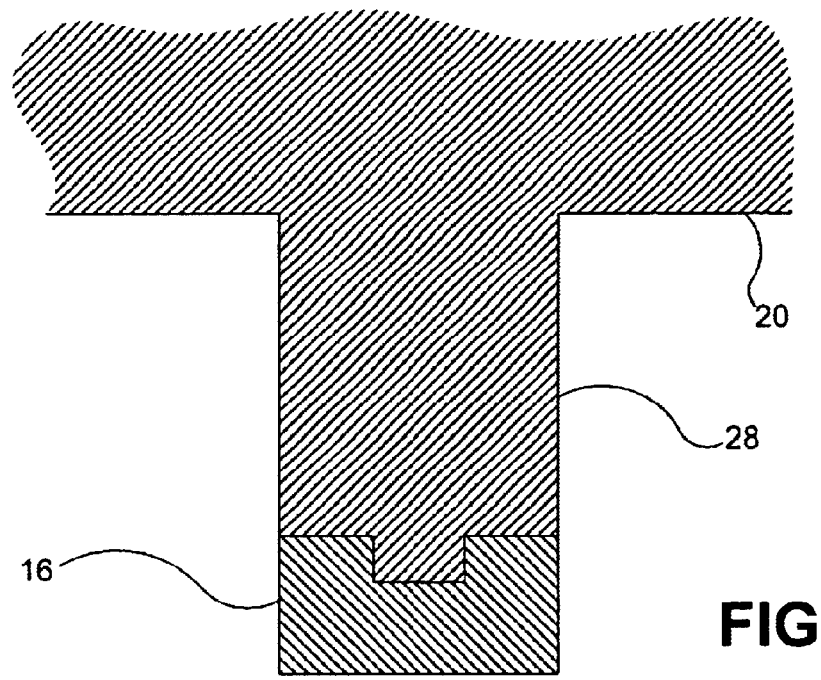

To assist in the alignment of a shield element 20 with bond fingers 16, each leg 28 may have a concave lower surface as shown in FIG. 5. The concave lower surface of leg 28 is shaped to receive the upper portion of a bond finger 16 (shown in cross section in the figure). Alternatively, as shown in FIG. 6, leg 28 may have a convex lower surface designed to mate with a corresponding recess in the upper surface of a bond finger 16.

Shield element 20 may be attached to bond fingers 16 by means of solder or epoxy. Mold compound may then be injection-molded around shield element 20 to form package mold 24, which provides physical, electrical and thermal isolation for package 10. Package mold 24 may be formed from any one of a variety of commercially available mold compounds such as epoxidized ortho cresol novolac (EOCN), biphenyl (BP), dicyclopentadiene (DCPD) and multifunctional (MF) compounds available from a variety of manufacturers.

Figure 7:
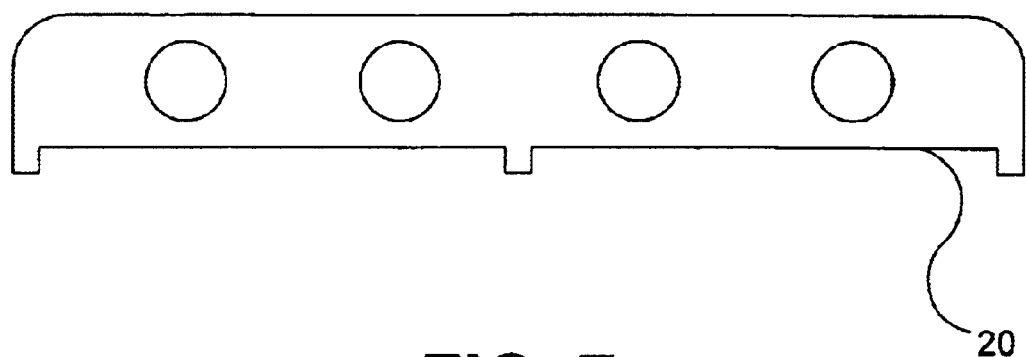
FIG. 7 is a side view of an alternatively-shaped shield element.
Figure 8:
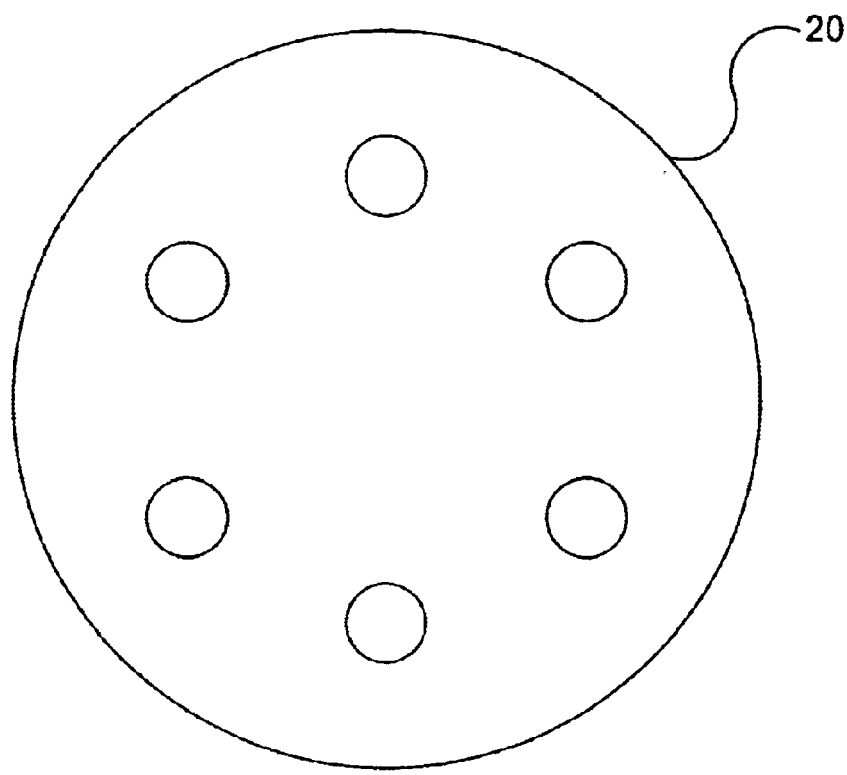
FIG. 8 is a top view of another alternatively-shaped shield element

To reduce the possibility of air pockets remaining inside shield element 20 during injection molding, shield element 20 may have rounded corners as shown in the top view of FIG. 4 and the side view of FIG. 7. Alternatively, shield element 20 may be circular in shape as shown in the top view of FIG. 8. In this case the side view remains substantially the same as that shown in FIG. 7.

Returning to FIG. 1, bond fingers 16 may have solder pads 26 formed on their bottom surfaces. Alternatively, bond fingers 16 may be electrically connected to solder pads 26 by means of interconnect wiring (not shown) on substrate 11. In either case, solder pads 26 are accessible from the bottom side of substrate 11 by means of through-holes or vias 27. Vias 27 may be formed by drilling through substrate 11.

Solder balls or bumps 29 are formed on solder pads 26 by conventional means. Solder bumps 29 may be, for example, conventional C4 solder bumps. Package 10 may be attached to a printed circuit board (not shown) by placing solder bumps 29 in contact with contact pads on the printed circuit board and reflowing solder bumps 29.

In an alternative embodiment, solder bumps 29 may be replaced by lands on the bottom surface of substrate 11. These lands may be electrically connected to bond fingers 16 by means of vias 27. However, in this embodiment, package 10 no longer has the simplicity of manufacturing associated with a single-sided substrate.

Figure 2:
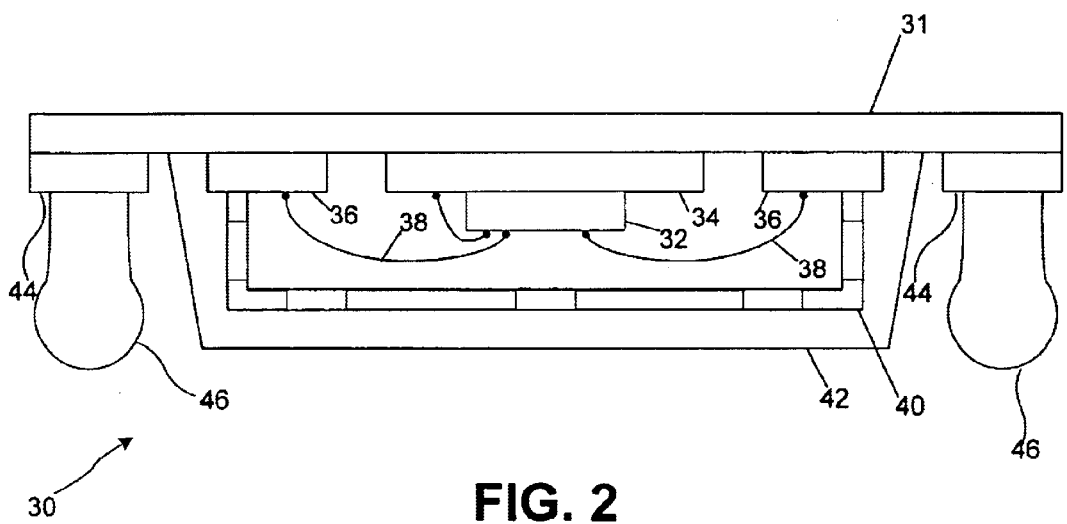
FIG. 2 is a vertical cross section of a second semiconductor chip package.

Referring to FIG. 2, another embodiment of the present invention is shown. FIG. 2 is a vertical cross section of a flip-chip semiconductor chip package 30 constructed in accordance with the present invention. Package 30, like package 10 previously described, provides integrated electromagnetic interference shielding for its semiconductor die.

Like package 10 described above, package 30 includes a package substrate 31, which may be a conventional epoxy laminate substrate. A die pad 34 and a set of bond fingers 36 are formed on substrate 31 using conventional conductive layer fabrication techniques. Substrate 31 is a single-sided substrate, meaning that a conductive layer including die pad 34, bond fingers 36 and conductive wiring (not shown) is formed on only one side of substrate 31. A semiconductor die 32 is mounted on a die pad 34 using a conventional die attach method and adhesive. Bond pads (not shown) on die 32 are electrically connected to respective bond fingers 36 by bond wires 38. Package 30 includes a shield element 40 which may have the same characteristics as shield element 20 previously described. For example, the leg shapes shown in FIGS. 5 and 6 may be used to achieve proper alignment of shield element 40 on substrate 31.

Package mold 42 may be created using conventional underfill techniques. Solder pads 44 are electrically connected to bond fingers 36 by means of interconnect wiring (not shown) on substrate 31. Solder bumps 46 may be formed on solder pads 44 by conventional means, allowing package 10 to be attached to a printed circuit board by reflowing solder bumps 46.

Although the present invention and its advantages have been described in detail, it should be understood that various changes, substitutions, and alterations can be made therein without departing from the spirit and scope of the invention as defined by the appended claims.

We claim:

1. A semiconductor chip package comprising:

a substrate;

a metallization layer formed on one side of the substrate, wherein the metallization layer comprises a plurality of bond fingers;

a semiconductor die mounted on the substrate, the semiconductor die being electrically connected at least some of the bond fingers;

a shield element mounted on the substrate, wherein the shield element is electrically attached to at least one of the bond fingers; and a package mold surrounding the semiconductor die and the shield element.

2. The semiconductor chip package of claim 1, wherein the metallization layer comprises:

a die pad formed on the substrate;

wherein the semiconductor die is attached to the die pad.

3. The semiconductor chip package of claim 2, further comprising a bond wire forming an electrical connection between a bond pad on the semiconductor die and one of the bond fingers.

4. The semiconductor chip package of claim 1, wherein the shield element comprises:

a substantially planar top surface; and a plurality of substantially planar side surfaces, the side surfaces being joined to the top surface and to each other with rounded corners.

5. The semiconductor chip package of claim 1, wherein the shield element comprises:

a horizontal top surface; and at least one vertical side surface, the side surface being joined to the top surface with a rounded corner.

6. The semiconductor chip package of claim 5 wherein the shield element comprises a plurality of openings formed in the top and side surfaces.

7. The semiconductor chip package of claim 5 wherein the top surface of the shield element is circular in shape.

8. The semiconductor chip package of claim 1, wherein the shield element comprises a plurality of legs attached to a corresponding plurality of the bond fingers.

9. The semiconductor chip package of claim 1, wherein at least one the legs of the shield element comprises a concave lower surface shaped to receive a corresponding one of the bond fingers.

10. The semiconductor chip package of claim 1, wherein at least one of the legs of the shield element comprises a convex lower surface, and wherein a corresponding one of the bond fingers comprises a concave upper surface shaped to receive the convex lower surface of the leg.

11. A shielded semiconductor device package comprising:

a substrate having a metallization pattern formed on one side of the substrate, the metallization pattern having a plurality of solderable surface mount pads;

a semiconductor device electrically attached to the metallization pattern and mechanically attached to the substrate;

a metal screen enclosing the semiconductor device and electrically and mechanically attached to a portion of the metallization pattern to shield the semiconductor device from radio frequency energy, wherein the metallization pattern comprises a plurality of bond fingers formed on the substrate and the metal screen is electrically attached to at least one of the bond fingers; and an insulating material transfer molded about the semiconductor device and encapsulating the metal screen.

12. The shielded semiconductor device package of claim 11, wherein the metallization pattern comprises:

a die pad formed on the substrate; and wherein the semiconductor die is attached to the die pad.

13. The shielded semiconductor device package of claim 11, wherein the metal screen comprises:

a substantially planar top surface; and a plurality of substantially planar side surfaces, the side surfaces being joined to the top surface and to each other with rounded corners.

14. The shielded semiconductor device package of claim 11, further comprising solder balls disposed on a side of the substrate opposite the metallization pattern and electrically coupled to the metallization pattern through the substrate.

15. The shielded semiconductor device package of claim 11, further comprising solder balls disposed on a same side of the substrate as the metallization pattern and electrically coupled to the metallization pattern.

16. The shielded semiconductor device package of claim 11, the metal screen comprises a plurality of legs electrically attached to a corresponding plurality of the bond fingers.

17. The shielded semiconductor chip package of claim 16 wherein at least one of the legs of the metal screen comprises a concave lower surface shaped to receive a corresponding bond finger.

18. The shielded semiconductor chip package of claim 16 wherein at least one of the legs of the metal screen comprises a convex lower surface, and wherein a corresponding bond finger comprises a concave upper surface shaped to receive the convex lower surface of the leg.

19. A semiconductor chip package comprising:

a substrate having first and second sides;

a metallization layer formed the first side of the substrate only, with no metallization layer being formed on the second side of the substrate, wherein the metallization layer comprises a plurality of bond fingers;

a semiconductor die mounted on the substrate, the semiconductor die being electrically connected to a portion of the metallization layer;

a shield element mounted on the substrate, wherein the shield element is electrically attached to at least one of the bond fingers.

20. The semiconductor chip package of claim 19, wherein the metallization layer comprises:

a die pad formed on the substrate; and wherein the semiconductor die is attached to the die pad.

21. The semiconductor chip package of claim 19, further comprising solder balls disposed on the first side of the substrate and electrically coupled to the metallization pattern.

* * * * *